United States Patent [19]
Schade

[11] 3,733,496
[45] May 15, 1973

[54] VARIABLE MODULO N SCS TYPE COUNTER

[76] Inventor: Peter A. Schade, 10650 Weymouth St., Bethesda, Md. 20014

[22] Filed: Feb. 22, 1972

[21] Appl. No.: 227,754

[52] U.S. Cl.........307/223 B, 307/221 B, 307/224 B, 307/226 B, 307/269, 307/305

[51] Int. Cl.........................H03k 23/08, G11c 19/00

[58] Field of Search......................307/221 B, 223 B, 307/224 B, 225 B, 226 B, 284, 305, 252 C, 252 G, 252 A, 252 J, 288; 315/84.5, 84.6; 328/37, 42, 45, 48, 51

[56] References Cited

UNITED STATES PATENTS

| | | | |
|---|---|---|---|
| 3,040,196 | 6/1962 | D'Asaro | 307/224 B |
| 3,290,515 | 12/1966 | Procter | 315/84.5 X |
| 3,309,537 | 3/1967 | Archer | 307/223 B |
| 3,329,834 | 7/1967 | Klinikowski | 307/221 B X |
| 3,351,784 | 11/1967 | McNulty et al. | 307/224 B X |
| 3,383,521 | 5/1968 | Greenberg | 307/221 B |
| 3,469,110 | 9/1969 | Sherman | 307/288 X |
| 3,500,068 | 3/1970 | Holz | 307/225 B |
| 3,504,193 | 3/1970 | Cake | 307/225 B X |

*Primary Examiner*—John W. Huckert
*Assistant Examiner*—L. N. Anagnos
*Attorney*—Brady, O'Boyle & Gates

[57] ABSTRACT

An N stage counter-divider comprising a plurality of series coupled semiconductor SCS type switches wherein the switch of each stage is comprised of two complementary transistors, one of which comprises a Schottky transistor, interconnected in the form of a four terminal device having an anode, a cathode, and a pair of gate electrodes referred to as the anode gate and the cathode gate. The anodes of the odd and even numbered stages are respectively connected together in parallel relationship and share a respective common load resistor. A flip-flop circuit controlled by a clock input signal has a pair of complementary outputs which are respectively coupled to the common load resistors through logic inverter circuits and thereby alternately apply a supply voltage to the odd and even numbered SCS anodes as the flip-flop is clocked.

11 Claims, 3 Drawing Figures

VARIABLE MODULO N SCS TYPE COUNTER

BACKGROUND OF THE INVENTION

1. Field of the Invention

This invention relates generally to semiconductor circuitry and more particularly to binary ring counters utilizing SCS type semiconductive devices.

2. Description of the Prior Art

Ring counters using active semiconductive devices such as transistors, SCR's and SCS's are well known to those skilled in the art. Most prior art counters utilizing such semiconductor devices have utilized capacitive coupling between devices or stages which limits the maximum speed of operation and makes fabrication of the counter on a single semiconductor chip quite difficult. Also, such counters have failed to have power supply potentials compatible with standard transistor-transistor logic (TTL) and/or diode-transistor logic (DTL). Prior art circuits also have had an inherent limitation in that output voltages in the "low" or conducting state of the SCS devices consisted of two saturated transistor voltage drops above a point of reference potential (ground) and as such have had logic levels incompatible with TTL or DTL logic. These circuits also have suffered from an inherent inability to provide: complete noise immunity from false triggering due to the *dv/dt* transients during a count transition, back triggering, and means for preventing more than one stage from being "on" at any time. One prior art ring counter worthy of note is disclosed in U.S. Pat. No. 3,329,834 issued to J. J. Klinikowski. This patent discloses the concept of driving alternate cathodes of an SCS ring counter by means of the complementary outputs of a flip-flop circuit; however, the circuitry disclosed in this patent also suffers from all of the limitations noted above. The existence of the above-noted limitations in prior art SCR type ring counters has prevented the common use of said circuits for integrated logic functions.

SUMMARY

The present invention is directed to means which overcome the disadvantages of the prior art by providing a semiconductor counter-divider which is particularly adaptable for integrated circuit fabrication, provides noise immunity from noise sources which are normally inherent in SCS counters, provides an output compatible with existing TTL or DTL logic levels even when Schottky barrier devices are utilized, and significantly increases the speed of operation.

Briefly, the subject invention is directed to an N stage SCS type counter wherein each counter stage is comprised of an integrated semiconductor switch device having four electrodes, and more particularly, a pair of interconnected complementary (P-N-P) and (N-P-N) transistors resulting in an anode, a cathode, and a pair of gate electrodes referred to as the anode gate and cathode gate. Preferably, each stage is comprised of a Schottky clamped SCS where the transistor making up the cathode gate comprises the Schottky transistor. Odd and even numbered anode electrodes are respectively commonly coupled together and are driven from the complementary outputs of a clocked flip-flop circuit wherein all of the even numbered stages and all of the odd numbered stages have a power supply potential alternately applied thereto through a respective common load resistor during alternate clock impulses to the flip-flop. Each stage of the counter also includes a single transistor and diode for coupling a trigger or count pulse to each succeeding stage in sequence.

Several important advantages are derived thereby. First, for an N stage SCS type counter, the number of SCS load resistors is reduced from N to 2. Secondly, substantially complete noise immunity from false triggering is obtained due to switching transients since the anode voltages only rise high enough to turn on one SCS during a count transition and thus insures the transfer of the count only to the following stage. This also results in only one stage being able to be turned on at any one time. Also, the RC time delay which normally occurs at the anode of an SCS which is turning "off" is eliminated which in combination with the Schottky diodes increases counting speed. Most importantly of all, however, the low or "zero" binary logic level as opposed to the high or "one" level is only one saturated transistor voltage drop above ground or a non-saturated Schottky transistor drop which is well within the tolerances necessary for complete compatibility with TTL or DTL logic levels.

DESCRIPTION OF THE PREFERRED EMBODIMENT

Figure 1:
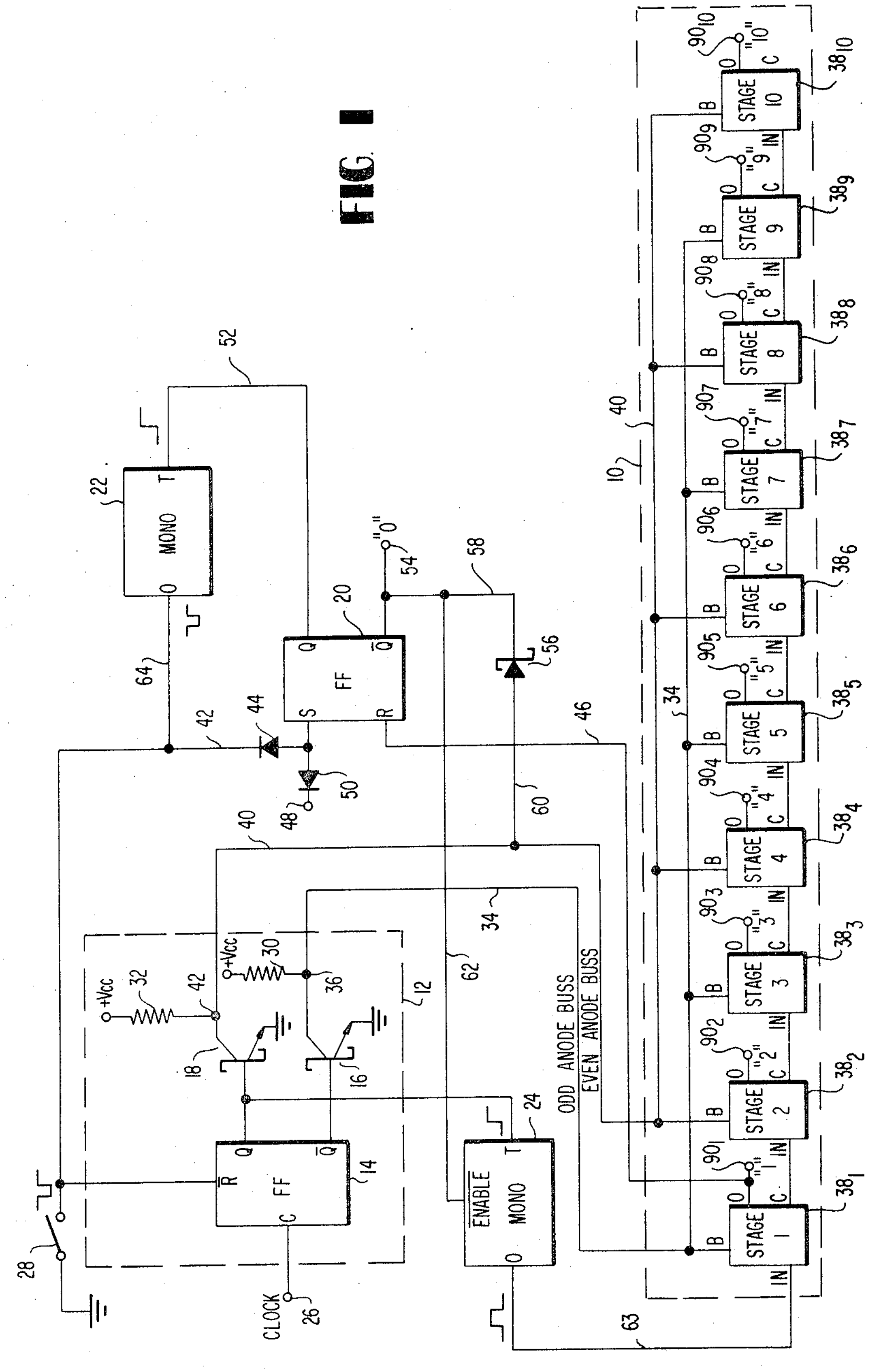
FIG. 1 is an electrical block diagram illustrative of an SCS type counter-divider embodying the subject invention.

Referring now to the drawings, FIG. 1 discloses a variable modulo N SCS type counter-divider preferably connected to a positive power supply potential ($V_{cc}$) of +5.0 volts, being capable of providing a maximum of 10 counts and an independent "short count" reset. It is comprised of the following circuit sections: (a) a serially connected ten stage counter section 10 which stores and transfers the count and provides one to ten count outputs; (b) a driver section 12 including a clocked resetable flip-flop circuit 14 and two Schottky transistor inverters 16 and 18; and (c) control circuitry including a second flip-flop circuit 20 and a pair of monostable circuits 22 and 24.

The flip-flop circuit 14 is conventional and is a clocked flip-flop including two inputs C and $\overline{R}$ and two complementary outputs Q and $\overline{Q}$. The C input is connected to an input terminal 26 which receives a clock input signal which comprises a sequence of pulses to be counted. The $\overline{R}$ input is coupled to a normally open reset switch 28 which has one terminal connected to a low potential (ground). The Q output of the flip-flop 14 is commonly connected to the base of the Schottky transistor 18 and to the trigger input T of the monostable circuit 24. The $\overline{Q}$ output is connected to the base of the Schottky transistor 16. The emitters of the Schottky transistors 16 and 18 are returned to ground and the collectors are connected to the positive supply potential $+V_{cc}$ through the respective load resistors 30 and 32. A circuit buss 34 defined as the "odd anode buss" is coupled from the junction 36 which is common to load resistor 32 to the odd numbered stages $38_1$, $38_3$, $38_5$, $38_7$ and $38_9$ of the counter section 10. In a like manner, a second circuit buss 40 defined as the "even anode buss" is connected from the load resistor 32 at junction 42 to the even numbered stages $38_2$, $38_4$, $38_6$, $38_8$ and $38_{10}$.

The second flip-flop circuit 20 includes two inputs S and R and two outputs Q and $\overline{Q}$. The S input is connected by means of circuit lead 42 and diode 44 to the reset switch 28 while the R terminal is coupled to the output of the first counter stage $38_1$ by means of circuit lead 46. A "short count" input terminal 48 is connected to S input of flip-flop 20 by means of the directional diode 50. The Q output of flip-flop 20 is connected to the trigger input terminal T of the monostable circuit 22 by means of circuit lead 52. The $\overline{Q}$ output is commonly connected to a zero count output terminal 54, a Schottky diode 56 and to the $\overline{ENABLE}$ input of the monostable circuit 24. The Schottky diode 56 has its cathode coupled to the Q output of flip-flop 20 by means of circuit lead 58 while the anode electrode is coupled to the even anode buss 40 by means of circuit lead 60. Completing the circuit connections for the configuration shown in FIG. 1, the output O of the monostable circuit 24 is connected by means of circuit lead 63 to the input of the first counter stage $38_1$, while the output $\overline{O}$ of the monostable circuit 22 is connected to the $\overline{R}$ input of the flip-flop circuit 14 by means of circuit lead 64.

Both flip-flop circuits 14 and 20 are circuits well known to those skilled in the art. The monostable circuits 22 and 24 comprise integrated circuit modules such as those manufactured and sold by Texas Instrument Corp., and identified by part number SN74121. These modules by selective interconnection of terminals can be operated as desired. For example, in the embodiment shown in FIG. 1, the first monostable circuit 24 is connected as a positive pulse generator such that if its trigger input terminal T goes high and the $\overline{ENABLE}$ is low, it generates a positive pulse at its output. The second monostable circuit 22, on the other hand, is a negative pulse generator such that if its trigger input terminal T goes high, it generates a negative going pulse at its output.

Figure 2:
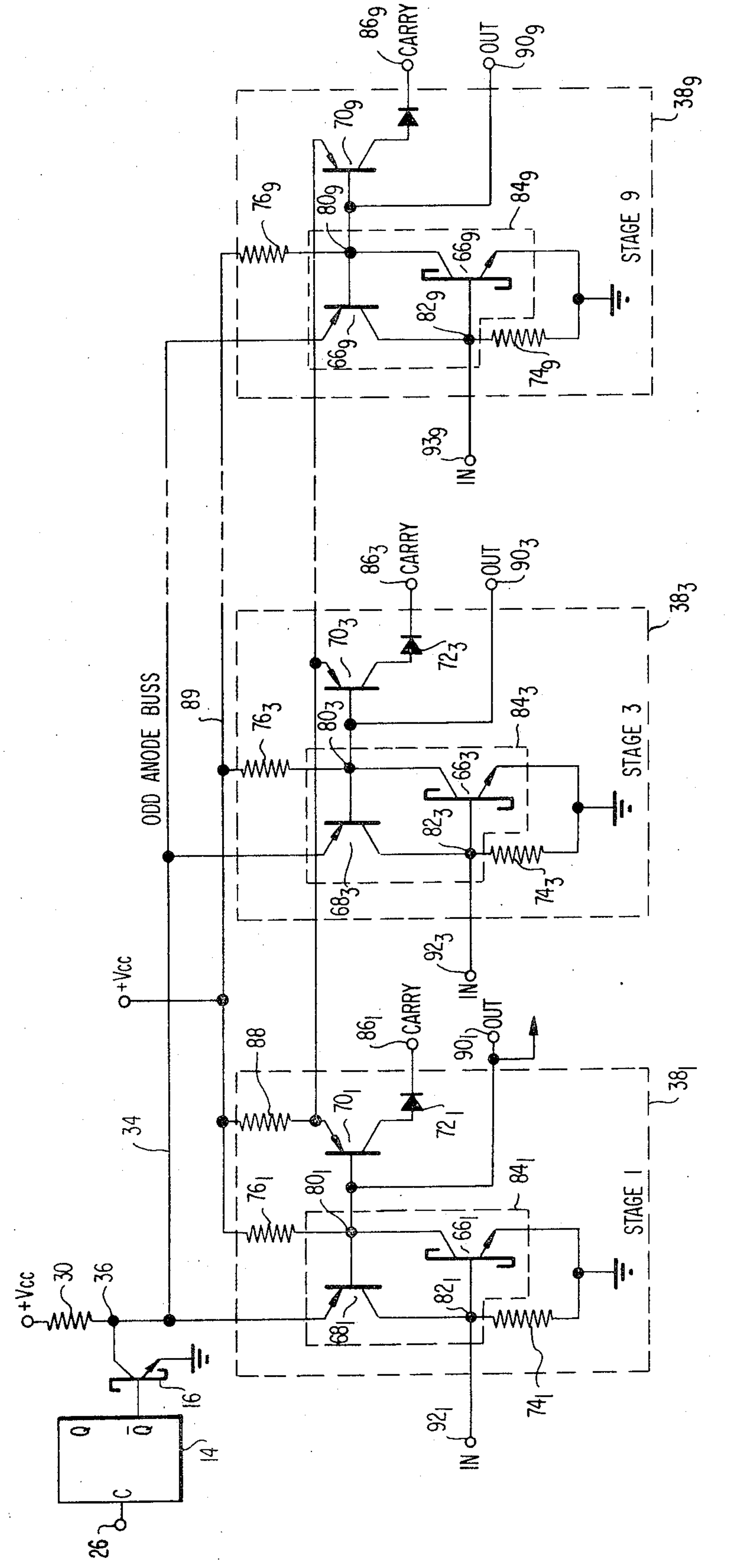
FIG. 2 is a partial electrical schematic diagram of the subject invention, being illustrative of circuit configuration of a single stage and the odd numbered stages of the embodiment shown in FIG. 1.
Figure 3:
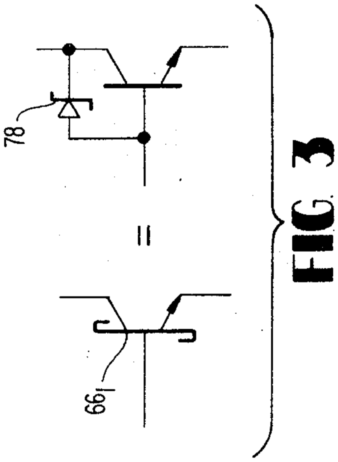
FIG. 3 is a schematic diagram illustrative of the equivalent circuit of a Schottky transistor.

Before discussing the overall operation of the embodiment shown in FIG. 1, consideration of the individual counter stages will first be given. The counter section 10 comprises ten serially connected stages $38_1$, $38_2$ ... $38_{10}$ which are identical in circuit configuration and therefore a description of one stage, for example the first stage, $38_1$, will suffice to explain the behavior of all the other stages. To this end, reference is now made to FIG. 2, wherein the first stage $38_1$ is comprised of four bipolar devices which include transistors $66_1$, $68_1$, $70_1$, and semiconductor diode $72_1$ and two bias resistors $74_1$ and $76_1$ for transistors $66_1$ and $68_1$, respectively. Transistor $66_1$ is preferably a Schottky clamped N-P-N transistor. Such a device includes a Schottky diode 78 coupled between its base and collector as depicted in FIG. 3. The Schottky transistor is completely disclosed in U.S. Pat. No. 3,463,975 issued to J. R. Biard. Transistor $68_1$ in combination with the Schottky transistor $66_1$ are complementary transistors P-N-P and N-P-N whose respective base and collector electrodes are alternately connected together at junction $80_1$ and $82_1$. The current-voltage characteristic at the emitter of transistor $68_1$ and the collector of transistor $66_1$ is characterized by an "S" shaped curve. Thus the combination may be correctly identified as a silicon controlled switch (SCS), a device well known to those skilled in the art.

With the application of a positive power supply potential $+V_{cc}$, the emitter and base of transistor $68_1$ are respectively identified as the anode and anode gate of what will henceforth be referred to as SCS $84_1$. Also the emitter and base of Schottky transistor $66_1$ are respectively identified as the cathode and cathode gate of SCS $84_1$. The anode of SCS $84_1$ which would normally serve as an output terminal is directly connected to the anodes of SCS $84_3$, $84_5$, $84_7$ and $84_9$ in the odd numbered stages of the counter by means of the odd anode buss 34. This loss of an output terminal is compensated for by the reduction in the required number of load resistors from five to one. This represents a considerable saving of space if the counter is fabricated as an integrated circuit device. The load resistor for all of the odd numbered stages $38_1$, $38_3$ ... $38_9$ comprises resistor 30 which is also the load resistor for the inverter transistor 16 included in the driver section 12 shown in FIG. 1. Although not disclosed, the anodes of the SCSs included in the even numbered counter stages $38_2$, $38_4$ ... $38_{10}$ are commonly connected in a like manner to the even anode buss 40 and share the common load resistor 32 (FIG. 1).

Referring again back to the first stage $38_1$, transistor $70_1$ is connected as an emitter follower to the anode gate of SCS $84_1$ at junction $80_1$. The collector of transistor $70_1$ is coupled to the anode electrode of diode $72_1$ which operates to transfer the count from the first stage $38_1$ to the second stage $38_2$ at the appropriate time. The transferred count signal appears at terminal $86_1$ which is labeled "carry". The emitter resistor 88 of transistor $70_1$ is preferably shared by all other odd stage transistors $70_3$ ... $70_9$ which perform a similar function and are interconnected by means of circuit lead 89.

Having described the components of the first stage $38_1$, the manner by which this stage receives, stores and transfers a count will now be discussed. Assuming that the reset switch 28 now momentarily is closed, a low input will be applied to the $\overline{R}$ input of the flip-flop 14 and the S input of flip-flop 20. This will force the Q and $\overline{Q}$ outputs of flip-flop 14 to go low and high, respectively. The Q and $\overline{Q}$ output of flip-flop 20, on the other hand, are forced to go high and low, respectively. The inverter transistors 16 and 18 are driven on and off, respectively, so that the odd anode buss 34 goes low and the even anode buss 40 tends to go high, due to the effect of transistor 18 turning off; however, the Schottky diode 56 is properly poled so that the $\overline{Q}$ output of flip-flop 20 which is now low causes the diode 56 to become conductive forcing the even buss 40 to go low also. With the odd and even buss 34 and 40 both being low, the SCSs of all of the counter stages $38_1$, $38_2$, $38_3$ ... $38_{10}$ are initially non-conductive, i.e. both transistors 66 and 68 of the respective stage are non-conductive due to the fact that the transistor 16 is conductive with the collector-emitter voltage thereof being in the order of +0.5 volts for a $V_{cc} = +5.0$ volts. Thus the emitter of transistor $68_1$ is reverse biased, making it non-conductive and therefore the output signal appearing at terminal $90_1$ which is common to the anode gate (junction $80_1$) will be high, i.e. at $+V_{cc}$. When the next clock pulse appears at terminal 26, the Q and $\overline{Q}$ outputs will go high and low respectively. The high output signal at the Q output is fed to the trigger input T of the monostable circuit 24 which has a low signal at the $\overline{ENABLE}$ input whereupon a positive pulse is provided at the output O. This positive pulse is coupled to the input terminal $92_1$ (FIG. 2) of the first counter stage $38_1$. Simultaneously therewith, the low going $\overline{Q}$ output of flip-flop 14 appears high at the odd anode buss 34 due to the inverting characteristic of transistor 16. The positive pulse appearing at input terminal $92_1$ appears at the cathode gate (junction $82_1$) of SCS $84_1$. The base of transistor $66_1$ and the emitter of transistor $68_1$ are thus forward biased whereupon regenerative feedback drives both transistors into an on condition. SCS $84_1$ is now conductive with its anode gate (junction $80_1$) in a low state. Since junction $80_1$ is low, transistor $70_1$ will also turn on.

The Schottky diode 78 shown in FIG. 3, which exists between the cathode gate and the anode gate of SCS $84_1$, prevents transistors $66_1$ and $68_1$ from going into deep saturation. This results in an anode gate voltage of approximately +0.5 volts which appears at junction $80_1$ and output terminal $90_1$. More importantly, however, is the corresponding reduction in storage of excess minority carriers in the base and collector of both transistors $66_1$ and $68_1$. Such an absence of stored excess charge means that the rise time or "turn-off" time of SCS $84_1$ is greatly enhanced. This characteristic is also discussed in the aforementioned Biard patent, U.S. Pat. No. 3,463,975.

After SCS $84_1$ of the first stage has latched, i.e. turned on, the odd anode buss 34 is now at a potential of approximately +1.1 volts. Thus the anodes of all odd stage SCSs except stage $38_1$ are reverse biased by a voltage equal to $+V_{cc}$ minus +1.1 volts. Also since the even anode buss 40 is connected to transistor 18 controlled by the Q output of the flip-flop 14, all of the even anodes are reverse biased by a voltage equal to $V_{cc}$ minus +0.5 volts. Thus with the latching or turning-on of SCS $84_1$, all other odd and even stages are effectively forced off, i.e. their output terminals $90_2$, $90_3$, $90_4$, etc. are high.

In addition, when the first stage $38_1$ is pulsed and the output signal at terminal $90_1$ goes low, the circuit lead 46 shown in FIG. 1 applies a low signal to the $\overline{R}$ input of flip-flop 20, whereupon the Q and $\overline{Q}$ outputs thereof go low and high, respectively. When the $\overline{Q}$ output of flip-flop 20 goes high, the monostable circuit 24 is disabled due to the low signal being applied to the $\overline{\text{ENABLE}}$ input via circuit lead 62.

The output terminal $90_1$ of the first stage $38_1$ remains at +0.5 volts until the flip-flop 14 receives another count pulse. When the second count pulse appears at terminal 26, the $\overline{Q}$ output of the flip-flop 14 goes high which now turns transistor 16 on. When transistor 16 becomes conductive, the odd anode buss 34 goes low to +0.5 volts and SCS $84_1$ is forced off. As SCS $84_1$ turns off, the charge stored in the base-emitter junction of transistor $70_1$ is transferred through diode $72_1$ to the cathode gate of the second stage SCS $84_2$. Simultaneously, the switching of the Q output of flip-flop 14 from the high state to a low state causes transistor 18 to become non-conductive, and thus allowing the even anode buss 40 to go high. Thus, the SCS $84_2$ of the second stage $38_2$ turns on and the output terminal $90_2$ (FIG. 1) goes low. In the manner previously discussed, the latching of the SCS in the second stage leaves the output terminals $90_1$, $90_3$, $90_4$ ... $90_{10}$ in a high state. Thus as each subsequent clock pulse is applied to the flip-flop 14 the odd and even anode busses 34 and 40 alternately go high and low causing a count pulse to be sequentially transferred to succeeding stages.

If a count of N equal to 10 is desired, terminal 48 is connected to terminal $90_{10}$ which is the output of the tenth stage $38_{10}$. When stage $38_{10}$ is pulsed, output terminal $90_{10}$ goes low. Thus a low signal is applied to terminal 48 which is coupled to the $\overline{S}$ input of flip-flop 20 through the diode 50 which causes the Q and $\overline{Q}$ output to now go high and low, respectively. Since the Q output of flip-flop 20 is coupled to the trigger input terminal T of monostable circuit 22, the high signal will cause a negative going trigger to be produced at its output O. Since circuit lead 64 is coupled back to the $\overline{R}$ of flip-flop 14, the flip-flop is reset and a new cycle as previously described begins again. For a count of N between 2 and 9, terminal 48 is connected to the Nth output stage terminal. When the Nth stage turns on, the low signal applied to terminal 48 institutes the same reset sequence as described above for a count of 10. Thus any count from 2 to 10 can be obtained by the connection of terminal 48 to the proper output.

The one component whose use should be particularly pointed out is the charge transfer diode $72_1$ in the first stage $38_1$ and the respective diodes in each of the other stages $38_2$ ... $38_{10}$. Diode $72_1$ prevents the Schottky clamped N-P-N transistor $66_2$ of stage $38_2$ from turning on prior to the first stage $38_1$ turn off by virtue of the 0.6 volts needed across the anode-cathode junction before it becomes conductive. Secondly, diode $72_1$ insures that the count will proceed from the second stage $38_2$ to the third stage $38_3$ instead of back to the first stage $38_1$ when stage $38_2$ switches off, i.e. prevents back-triggering.

What has been shown and described therefore is a variable modulo N SCS type counter-divider incorporating a flip-flop circuit which alternately drives odd and even numbered bussed anodes of SCS devices. This connection reduces the number of load resistors from N to two, prevents false triggering of an off SCS stage, and insures compatability of all of the counter outputs with existing DTL and TTL integrated circuits. Furthermore, correct transfer of the count is insured with only one transistor and one diode per stage.

I claim:

1. A semiconductor counter circuit, comprising in combination:

a plurality of four terminal semiconductor switch devices coupled together in a cascade circuit configuration with each device being part of either an even numbered or an odd numbered set;

each device having an anode electrode which is connected to a shared load resistor, a cathode electrode which is connected to a point of reference potential, an anode gate electrode which operates as an output electrode, and a cathode gate which operates as an input electrode to receive triggering pulses which is adapted to turn on the device when a first voltage level appears at said anode electrode, said device also turning off when a second voltage level appears at said anode electrode;

said anode electrodes of said devices in said even numbered set being commonly connected together and said anode electrodes of said devices in said odd numbered set being commonly connected together;

a first and a second shared load resistor respectively connected to the anodes of the devices in said even numbered set and said odd numbered set;

semiconductor means coupling the anode gate of one device to the cathode gate of the succeeding device for translating a triggering pulse thereto; and a flip-flop circuit having an input responsive to a sequence of input control pulses and providing a first and a second complementary output, including first means coupling said first output to the anode side of said first shared load resistor of said even numbered set, and second means coupling said second output to the anode side of said second shared load resistor of said odd numbered set, said flip-flop being operable to change the binary state of said complementary outputs in response to each input pulse and alternately drive the anode electrodes of the even numbered and odd numbered sets between mutually opposite first and second binary voltage levels thereby alternately enabling one set of switches while inhibiting the other set of switches.

2. The circuit as defined by claim 1 wherein each switch is comprised of a pair of complementary transistors having base, emitter and collector electrodes, and wherein the collector of one transistor is connected to the base of the other transistor and the collector electrode of said other transistor is connected to the base of said one transistor.

3. The circuit as defined by claim 1 wherein each of said switch devices is comprised of a first and a second transistor of a mutually opposite conductivity type, each transistor having a base electrode, and emitter electrode and a cathode electrode and interconnected such that said anode electrode comprises the emitter electrode of said first transistor, said cathode electrode comprises the emitter electrode of said second transistor, said anode gate comprises a common connection between the base electrode of said first transistor and the collector electrode of the second transistor, and said cathode gate comprises a common connection between the collector electrode of said first transistor and the base electrode of said second transistor.

4. The circuit as defined by claim 3 wherein said first transistor comprises a P-N-P transistor and said second transistor comprises an N-P-N transistor.

5. The circuit as defined by claim 3 wherein said second transistor comprises a Schottky transistor.

6. The circuit as defined by claim 1 wherein said four terminal semiconductor switch devices are comprised of Schottky type controlled rectifiers.

7. The circuit as defined by claim 1 wherein said first and second coupling means respectively comprise a first and second transistor inverter circuit.

8. The circuit as defined by claim 1 wherein said semiconductor coupling means comprises a transistor having a base, a collector, and emitter electrodes and additionally including circuit means coupling said base electrode to said anode gate of said one device and the collector electrode to the cathode gate of the succeeding device and additionally including a load resistor coupled between said emitter electrode and a supply voltage, said transistor being operable to be turned on and off along with said switch device, however, in turning off transfers the charge stored in its base-emitter junction to the collector electrode and thereby producing and coupling a triggering pulse for the succeeding device.

9. The circuit as defined by claim 8 and additionally including a semiconductor diode coupled between said collector electrode and said cathode gate of the succeeding device and poled to translate said triggering pulse to the succeeding device.

10. The circuit as defined by claim 1 and additionally including circuit means coupled between one of said complementary outputs of said flip-flop and said cathode gate of said first semiconductor switch device being selectively enabled when said flip-flop is reset for coupling a trigger pulse to said first semiconductor switch device and thereafter being rendered inoperative until said flip-flop is again reset.

11. The invention as defined by claim 1 and additionally including circuit means coupled to said flip-flop circuit, selectively applying a control signal thereto whereby said flip-flop circuit operates to provide an initial output state of said complementary outputs and means coupled from said last-recited means to a selected set of anode electrodes for rendering the binary voltage level of both sets of anode electrodes at the same binary voltage level only during said initial output state of said flip-flop circuit.

* * * * *